(12) United States Patent  
Morikawa

(10) Patent No.: US 6,707,725 B2
(45) Date of Patent: Mar. 16, 2004

(54) REFERENCE VOLTAGE GENERATION CIRCUIT FOR SEMICONDUCTOR MEMORY DEVICE, MEMORY READING CIRCUIT INCLUDING SAME, AND ELECTRONIC INFORMATION DEVICE INCLUDING THE SAME

(75) Inventor: Yoshinao Morikawa, Ikoma (JP)

(73) Assignee: Sharp Kabushiki Kaisha, Abeno-ku (JP)

( * ) Notice: Subject to any disclaimer, the term of this patent is extended or adjusted under 35 U.S.C. 154(b) by 169 days.

(21) Appl. No.: 10/087,471

(22) Filed: Feb. 28, 2002

(65) Prior Publication Data

US 2002/0122336 A1 Sep. 5, 2002

(30) Foreign Application Priority Data

Mar. 1, 2001 (JP) ........................................ 2001-057499

(51) Int. Cl.[7] ............................................... G11C 7/000
(52) U.S. Cl. .................. 365/189.09; 365/196; 365/205; 365/210; 365/226
(58) Field of Search ........................... 365/189.09, 196, 365/205, 210, 226

(56) References Cited

U.S. PATENT DOCUMENTS

| 5,444,656 | A | * | 8/1995 | Bauer et al. .............. 365/185.2 |
| 5,572,465 | A | * | 11/1996 | Bashir .................... 365/185.21 |
| 5,912,838 | A | * | 6/1999 | Chevallier ............. 365/185.03 |
| 6,324,094 | B1 | * | 11/2001 | Chevallier ............. 365/185.03 |
| 6,362,661 | B1 | * | 3/2002 | Park ............................ 327/53 |
| 6,456,549 | B1 | * | 9/2002 | Sudo et al. ................. 365/207 |

FOREIGN PATENT DOCUMENTS

| JP | 11-306782 | 11/1999 |
| JP | 2000-030475 | 1/2000 |

* cited by examiner

Primary Examiner—Viet Q. Nguyen
(74) Attorney, Agent, or Firm—Morrison & Foerster LLP

(57) ABSTRACT

A reference voltage generation circuit includes at least one reference cell having a source electrode and a drain electrode; a plurality of first sense circuits connected to the reference cell and including an N-channel transistor, a P-channel transistor, a plurality of input ends and a plurality of output ends; and a plurality of second sense circuits each for receiving an output from a corresponding one of the plurality of first sense circuits, the plurality of second sense circuits each having a load circuit, an N-channel transistor, a plurality of input ends and a plurality of output ends.

20 Claims, 14 Drawing Sheets

Reading memory cell    Reference cell

Reading memory cell    Reference cell

REFERENCE VOLTAGE GENERATION CIRCUIT FOR SEMICONDUCTOR MEMORY DEVICE, MEMORY READING CIRCUIT INCLUDING SAME, AND ELECTRONIC INFORMATION DEVICE INCLUDING THE SAME

CROSS-REFERENCE TO RELATED APPLICATIONS

This application claims priority to Japanese Patent Application Number 2001-057499 filed Mar. 1, 2001, the content of which is incorporated herein by reference in its entirety.

BACKGROUND OF THE INVENTION

1. Field of the Invention

The present invention relates to a semiconductor memory device such as, for example, an electrically rewritable nonvolatile memory. In particular, the present invention relates to a reference voltage generation circuit used for a plurality of sense amplifiers for simultaneously reading information from a plurality of memory cells using a reference voltage obtained from a reference cell, a memory reading circuit including such a reference voltage generation circuit, and an electronic information device, such as, for example, a cellular phone or a computer using such a memory reading circuit.

2. Description of the Related Art

Conventionally, semiconductor memory devices such as, for example, EEPROMs (Electrically Erasable and Programmable Read Only Memories) and flash EEPROMs (hereinafter, referred to as the "flash memories") are known as electrically rewritable nonvolatile memories. These semiconductor memory devices each include a sense amplifier circuit (sense amplifier) and circuits related thereto as a memory reading circuit for reading information memory cell transistors (hereinafter, referred to as "memory cells").

An exemplary structure of a sense amplifier circuit and circuits related thereto is now described. In this example, a memory cell, from which the sense amplifier and the like read information, includes a stacking gate electrode, which is formed of polycrystalline silicon and has a two-layer structure of a control gate electrode and a floating gate electrode.

According to one operating principle of a memory cell having a stacking gate structure, information is stored based on whether the floating gate electrode is in a state of containing electrons or in a state of not containing electrons.

Herein, an operation for placing the floating gate electrode into a state of containing electrons will be referred to as a "writing operation", and an operation for placing the floating gate electrode into a state of not containing electrons will be referred to as an "erasing operation". The writing operation and the erasing operation will not be described in detail.

A memory cell in which the floating gate electrode is in the state of containing electrons (obtained by the writing operation) will be referred to as a "program cell". A memory cell in which the floating gate electrode is in the state of not containing electrons (obtained by the erasing operation) will be referred to as an "erase cell". When a voltage is applied to the control gate electrode and a bias voltage is applied to a source electrode and a drain electrode of each of the program cell and the erase cell, the amount of current flowing in the program cell is smaller than that in the erase cell. (The state in which the above-mentioned voltages are applied to the control gate electrode, the source electrode and the drain electrode will be referred to as a "memory cell reading condition"). The reason that the amount of current flowing in the program cell is smaller is because in accordance with whether the floating gate electrode contains electrons or not, the electric field intensity, applied to the channel region of the memory cell when a voltage is applied to the control gate electrode, changes, thus the amount of current flowing in the memory cell also changes. The electric field intensity, obtained when a voltage is applied to the control gate electrode, changes in accordance with the number of electrons existing in the floating gate electrode. In accordance with the electric field intensity, the amount of current changes as described above. Here, whether the floating gate electrode contains electrons or not indicates whether the number of electrons in the floating gate electrode is relatively large or small.

By the above-described principle, data value "0" is stored in a memory cell when the amount of current is small, and data value "1" is stored in a memory cell when the amount of current is large.

The sense amplifier circuit determines whether the amount of current flowing in each memory cell under the memory cell reading condition is small or large, and outputs data value "0" or data value "1" based on the determination result. The determination on whether the amount of current is small or large can be made with respect to the amount of a reference current. In this case, a transistor having a structure similar to that of the memory cells (hereinafter, referred to as a "reference cell") can be used in order to produce the reference current. Such a transistor is produced so as to have the same influences of the temperature characteristics and voltage characteristics for reading memory cells as those of the memory cells.

The current amount of the reference cell can be an intermediate value between the current amount of the program cell and the current amount of the erase cell. The number of electrons in the floating gate electrode of the reference cell can be adjusted to be between the number of electrons in the floating gate electrode of the program cell and that of the erase cell.

FIG. 10 is a circuit configuration of a sense amplifier circuit 100 in a conventional flash memory. As shown in FIG. 10, the sense amplifier circuit 100 includes a memory cell section 101 including a selection circuit; a feedback-type current detection circuit 102, which is connected to a drain electrode of a memory cell 101b for reading (reading memory cell 101b) through a selection transistor 101a of the selection circuit; a reference cell section 103 acting as a reference current generation circuit and having a structure similar to that of the reading memory cell 101b, the reference cell section 103 also including a selection circuit; a feedback-type current detection circuit 104 having a structure similar to that of the reading memory cell 101b and connected to a drain electrode of a reference cell 103b through a selection transistor 103a of the selection circuit; and a comparator circuit 105 for comparing a voltage output from the reading memory cell 101b and a voltage output from the reference cell 103b.

The current detection circuits 102 and 104 each use a load circuit for performing current-voltage conversion in order to obtain a voltage, which is to be output to the comparator circuit 105. Transistor loads 102a and 104a shown in FIG. 11 and resistance loads 102b and 104b shown in FIG. 12 are examples of such a load circuit.

In order to perform a reading operation from the reading memory cell 101b, the sense amplifier circuit 100 shown in FIG. 10 can include a charging circuit 106 for providing the drain electrode of the reading memory cell 101b with a bias voltage of the memory cell reading condition, and can also include a charging circuit 107 for providing the drain electrode of the reference cell 103b with a bias voltage of the memory cell reading condition.

With reference to FIG. 10, a reading operation performed on the conventional sense amplifier circuit 100 will be described.

As shown in FIG. 10, a gate voltage to be applied for performing the reading operation (hereinafter, referred to as a "reading gate voltage") is applied to the control gate electrode of the reading memory cell 101b selected by the selection transistor 101a. Simultaneously, a drain voltage to be applied for performing the reading operation (hereinafter, referred to as a "reading drain voltage") is applied to the drain electrode of the selected reading memory cell 101b through the selection transistor 101a by the charging circuit 106, transistor load 102a (FIG. 11) and the resistance load 102b (FIG. 12).

The charging circuits 106 and 107 operates until the drain electrode of the memory cell 101b and the drain electrode of the reference cell 103b obtain the drain voltage of the memory cell reading condition. After the drain voltage is reached, the charging circuits 106 and 107 stop operating. A source electrode of the selected reading memory cell 101b is grounded through a transistor or the like, and thus a current flows between the drain electrode and the source electrode of the selected reading memory cell 101b (hereinafter, this current will be referred to as a "reading current").

The reading current is converted into a voltage by the load of the current detection circuit 102, and the voltage is input to one of two input ends of the comparator circuit 105 (Hereinafter, this voltage will be referred to as a "reading voltage").

Substantially the same operation is performed for the reference cell 103b. As a result, a reference current flows between the drain electrode and the source electrode of the reference cell 103b. The reference current is converted into a voltage by the load of the current detection circuit 104, and the voltage is input to the other input end of the comparator circuit 105 (hereinafter, the voltage obtained from the reference current will be referred to as a "reference voltage").

The reading current of a selected reading memory cell 101b containing electrons in the floating gate electrode, i.e., the program cell, is smaller than the reference current. The reading current is converted into a voltage by the load of the feedback-type current detection circuit 102 as described above. The obtained reading voltage is higher than the reference voltage obtained from the reference cell 103b. The reading voltage and the reference voltage respectively pass through the load of the feedback-type current detection circuits 102 and 104. Therefore, the difference between the reading voltage and the reference voltage is amplified as compared to the case where there is no load provided in the feedback-type current detection circuit 102 or 104.

The reading voltage and the reference voltage are compared by the comparator circuit 105, and the comparison result is output as a memory information reading result in the form of an "L" (low) level potential or an "H" (high) level potential.

The reading voltage of a selected reading memory cell 101b not containing electrons in the floating gate electrode, i.e., the erase cell, is lower than the reference voltage. In this case, the comparator circuit 105 outputs a memory information reading result which is inverted from that of the program cell.

Ideally, one sense amplifier circuit 100 shown in FIG. 10 is provided for reading information from each memory cell 101b (1 bit). In order to improve the functionality of the flash memory, however, it is sometimes required that one sense amplifier circuit 100, as shown in FIG. 10, should be provided for reading information from a plurality of cells (a plurality of bits). In this case, as shown in FIG. 13, the reference cell 103b and the current detection circuit 104 (using the load) can be commonly used for reading information from a plurality of memory cells 101b. In such a structure, the reference voltage output from the current detection circuit 104 (provided for the reference current) is sent to the comparator circuits 105 respectively provided for the plurality of memory cells 101b.

FIG. 14 shows a configuration of a differential amplifier as one specific example of the comparator circuit 105. The reading voltage and the reference voltage are respectively input to the gate electrode of a transistor 105A (gate voltage) and the gate electrode of a transistor 105B (gate voltage) provided in the comparator circuit 105. The differential amplifier is operated in this state. Then, a current corresponding to the gate voltage of the transistor 105A flows between the source and the drain of the transistor 105A, and a current corresponding to the gate voltage of the transistor 105B flows between the source and the drain of the transistor 105B.

The current flowing between the drain electrode and the source electrode influences the gate voltage because of a generally known coupling effect of a gate oxide layer acting as a capacitor. The gate oxide layer is provided between the gate electrode and the source electrode/drain electrode/channel region of the transistors 105A and 105B.

In the case where the reference voltage is input to only one differential amplifier, the influence caused by the coupling effect is negligible for the reading operation.

By contrast, in the case where the reference voltage is commonly input to a plurality of differential amplifiers, the influence caused by the coupling effect on the reference voltage increases as the number of differential amplifiers increases. As a result, the difference between the influence caused by the coupling effect on the reference voltage and the influence caused by the coupling effect on the reading voltage excessively increases, and may undesirably influence the reading operation.

When the differential amplifiers are not intermittently operated, the influence caused by the coupling effect disappears in time and the reading operation is returned to normal even though data is incorrectly read while the reading operation is influenced by the coupling effect.

However, the influence caused by the coupling effect still has the following problems.

When data is incorrectly read under the influence caused by the coupling effect, the reading speed of the memory cell is slower as compared to the case where there is no influence caused by the coupling effect.

In order to reduce the operating current, the differential amplifier is sometimes operated as follows. The differential amplifier is operated during a certain time period to perform a reading operation from a selected memory cell, and after data from the differential amplifier is sent to and stored in a latch circuit or the like, the differential amplifier stops operating and outputs the read data from the reading circuit. In such a manner of operation, data needs to be read correctly in the above-mentioned "certain time period".

When the influence caused by the coupling effect is excessive, the "certain time period" becomes too long to realize a high speed reading operation. In order to prevent the coupling effect from influencing the reading operation, the reference voltage and the reading voltage need to have a potential difference therebetween which does not results in the influence caused by the coupling effect. However, it is becoming more and more difficult to keep the difference between the reading current and the reference current sufficiently large, due to reduction in the memory cell current necessitated by recent demand for reducing the size of memories.

The difference between the reading current and the reference current can be kept sufficiently large by increasing the voltage difference between the source electrode and the drain electrode of the memory cell itself so that a larger amount of current flows in the memory cell. However, in actuality, the drain voltage cannot be very high since an excessively high drain voltage may destroy the state of containing electrons of the floating gate electrode which is formed by the writing operation.

For these reasons, the difference between the reading voltage and the reference voltage is not very large, and thus it is very difficult to acquire the voltage difference necessary to prevent the influence caused by the coupling effect.

Even in a sense amplifier circuit disclosed in Japanese Laid-Open Publication No. 11-306782 including a different type of comparator circuit, the influence caused by the coupling effect cannot be ignored.

In order to solve the above-described problems, the "Semiconductor Memory Device" disclosed in Japanese Laid-Open Publication No. 2000-30475 is a proposed system for generating a reference current and a reference voltage for a plurality of sense amplifier circuits and simultaneously operating the plurality of sense amplifier circuits without increasing the chip area. Such a system is shown in FIG. 15.

The system disclosed in Japanese Laid-Open Publication No. 2000-30475 includes a reference cell block 110. The reference cell block 110 includes a circuit 110A corresponding to the reference cell 103b (FIG. 10) and a current mirror circuit 110B.

As shown in FIG. 16, a current source having characteristics similar to those of the reference cell block 110 is generated by the current mirror circuit 110B in at least one reference cell block 110 and is supplied to a plurality of sense amplifier circuits 111 as a reference current.

Such a structure avoids the above-described influence caused by the coupling effect. However, when a plurality of reference currents, for example, 16 are generated by one reference cell block 111, 16 gate capacitances can be connected to a node N in FIG. 16. When the number of gate capacitances is excessively large, the current characteristics are delayed between the time when the current is generated by the reference cell block 110 and the time when the current is supplied to the sense amplifiers 111.

When the number of gate capacitances connected to the node N is excessively large, time is required for charging the node N to a desired potential. During a time period in which the node N has not been charged to the desired potential, the current amount of each of the plurality of reference currents is different from the current amount desired to be finally obtained. When the characteristics of the reference current are delayed between the time of generation and the time of supply, it is necessary to wait for the delay to be eliminated. Thus, a high speed reading operation of information in the memory cells is prevented.

The reference voltage generation circuit disclosed in Japanese Laid-Open Publication No. 2000-30475 does not have a function of amplification. Therefore, when the amount of current in a memory cell is reduced, the sensitivity of the sense amplifier circuit is deteriorated, which also prevents a high speed reading operation of information in the memory cells.

SUMMARY OF THE INVENTION

A reference voltage generation circuit includes at least one reference cell having a source electrode and a drain electrode; a plurality of first sense circuits connected to the reference cell and including an N-channel transistor, a P-channel transistor, a plurality of input ends and a plurality of output ends; and a plurality of second sense circuits each for receiving an output from a corresponding one of the plurality of first sense circuits, the plurality of second sense circuits each having a load circuit, an N-channel transistor, a plurality of input ends and a plurality of output ends.

In one embodiment of the invention, the plurality of first sense circuits each generate a first duplicate voltage based on a voltage from the reference cell, and the plurality of second sense circuits each generate a second duplicate voltage based on the first duplicate voltage.

In one embodiment of the invention, the memory reading circuit for a semiconductor memory device includes the above-described reference voltage generation circuit; a third sense circuit connected to a selected memory cell and having an N-channel transistor, a P-channel transistor, a plurality of input ends and a plurality of output ends; and a fourth sense circuit for receiving an output from the third sense circuit, the fourth sense circuit having a load circuit, an N-channel transistor, a plurality of input ends and a plurality of output ends. The information is read using an output from each of the plurality of second sense circuits and an output from the fourth sense circuit.

In one embodiment of the invention, in the memory reading circuit for reading information from the selected memory cell by supplying a reference voltage to one of two input ends of a sense amplifier and supplying a voltage from the selected memory cell to the other of the two input ends, an output from each of the plurality of second sense circuits and an output from the fourth sense circuit are input to the sense amplifier.

In one embodiment of the invention, the load circuit of each of the plurality of second sense circuits of the reference voltage generation circuit is a P-channel transistor, and the load circuit of the fourth sense circuit is a P-channel transistor. A gate electrode and a drain electrode of one of the plurality of second sense circuits are connected to a gate electrode of the P-channel transistor of the fourth sense circuit, so that a load characteristic of the fourth sense circuit is equal to a load characteristic of the one of the plurality of second sense circuits.

In one embodiment of the invention, the reference voltage generation circuit shortcircuits an output from the fourth sense circuit and an output from the one of the plurality of second sense circuits through a transistor, and the output from the fourth sense circuit and the output from the one of the plurality of second sense circuits are transferred to a respective prescribed potential from the same level after being released from the shortcircuiting.

In one embodiment of the invention, an output from each of the plurality of second sense circuits and an output from the fourth sense circuit are shorcircuitable, and the output from the fourth sense circuit is output through an inverter circuit.

In one embodiment of the invention, the load circuit of each of the plurality of second sense circuits of the reference voltage generation circuit is a P-channel transistor, and the load circuit of the fourth sense circuit is a P-channel transistor. A gate electrode and a drain electrode of one of the plurality of second sense circuits are connected to a gate electrode of the P-channel transistor of the fourth sense circuit, so that a load characteristic of the fourth sense circuit is equal to a load characteristic of the one of the plurality of second sense circuits.

In one embodiment of the invention, the reference voltage generation circuit shortcircuits an output from the fourth sense circuit and an output from the one of the plurality of second sense circuits through a transistor, and the output from the fourth sense circuit and the output from the one of the plurality of second sense circuits are transferred to a respective prescribed potential from the same level after being released from the shortcircuiting.

In one embodiment of the invention, the memory reading circuit for a semiconductor memory device includes the above-described reference voltage generation circuit; a third sense circuit connected to a selected memory cell and having an N-channel transistor, a P-channel transistor, a plurality of input ends and a plurality of output ends; and a fourth sense circuit for receiving an output from the third sense circuit, the fourth sense circuit having a load circuit, an N-channel transistor, a plurality of input ends and a plurality of output ends. The information is read using an output from each of the plurality of second sense circuits and an output from the fourth sense circuit.

In one embodiment of the invention, in the memory reading circuit for reading information from the selected memory cell by supplying a reference voltage to one of two input ends of a sense amplifier and supplying a voltage from the selected memory cell to the other of the two input ends, an output from each of the plurality of second sense circuits and an output from the fourth sense circuit are input to the sense amplifier.

In one embodiment of the invention, the load circuit of each of the plurality of second sense circuits of the reference voltage generation circuit is a P-channel transistor, and the load circuit of the fourth sense circuit is a P-channel transistor. A gate electrode and a drain electrode of one of the plurality of second sense circuits are connected to a gate electrode of the P-channel transistor of the fourth sense circuit, so that a load characteristic of the fourth sense circuit is equal to a load characteristic of the one of the plurality of second sense circuits.

In one embodiment of the invention, the reference voltage generation circuit shortcircuits an output from the fourth sense circuit and an output from the one of the plurality of second sense circuits through a transistor, and the output from the fourth sense circuit and the output from the one of the plurality of second sense circuits are transferred to a respective prescribed potential from the same level after being released from the shortcircuiting.

In one embodiment of the invention, the memory reading circuit further includes a load circuit for performing current-to-voltage conversion of the selected memory cell and the reference cell, the load circuit including at least one of a transistor and a resistor, wherein the load circuit is directly connected to a drain electrode of the selected memory cell and the drain electrode of the reference cell.

In one embodiment of the invention, an output from each of the plurality of second sense circuits and an output from the fourth sense circuit are shortcircuitable, and the output from the fourth sense circuit is output through an inverter circuit.

In one embodiment of the invention, the load circuit of each of the plurality of second sense circuits of the reference voltage generation circuit is a P-channel transistor, and the load circuit of the fourth sense circuit is a P-channel transistor. A gate electrode and a drain electrode of one of the plurality of second sense circuits are connected to a gate electrode of the P-channel transistor of the fourth sense circuit, so that a load characteristic of the fourth sense circuit is equal to a load characteristic of the one of the plurality of second sense circuits.

In one embodiment of the invention, the reference voltage generation circuit shortcircuits an output from the fourth sense circuit and an output from the one of the plurality of second sense circuits through a transistor, and the output from the fourth sense circuit and the output from the one of the plurality of second sense circuits are transferred to a respective prescribed potential from the same level after being released from the shortcircuiting.

In one embodiment of the invention, the memory reading circuit further includes a load circuit for performing current-to-voltage conversion of the selected memory cell and the reference cell, the load circuit including at least one of a transistor and a resistor, wherein the load circuit is directly connected to a drain electrode of the selected memory cell and the drain electrode of the reference cell.

In one embodiment of the invention, an electronic information device capable of reading information using the above-described memory reading circuit is provided.

According to one aspect of the invention, a reference voltage generation circuit includes at least one reference cell having a source electrode and a drain electrode; a plurality of first pre-sense circuits connected to the reference cell and including an N-channel transistor, a P-channel transistor, a plurality of input ends and a plurality of output ends; and a plurality of second pre-sense circuits each for receiving an output from a corresponding one of the plurality of first pre-sense circuits, the plurality of second pre-sense circuits each having a load circuit, an N-channel transistor, a plurality of input ends and a plurality of output ends.

In one embodiment of the invention, the plurality of first pre-sense circuits each generate a first duplicate voltage based on a voltage from the reference cell, and the plurality of second pre-sense circuits each generate a second duplicate voltage based on the first duplicate voltage.

In one embodiment of the invention, a memory reading circuit for a semiconductor memory device for reading information from a selected memory cell by supplying a reference voltage to one of two input ends of a sense amplifier and supplying a voltage from the selected memory cell to the other of the two input ends is provided. The memory reading circuit includes a reference voltage generation circuit described above; a third pre-sense circuit connected to the selected memory cell and having an N-channel transistor, a P-channel transistor, a plurality of input ends and a plurality of output ends; and a fourth pre-sense circuit for receiving an output from the third pre-sense circuit, the fourth pre-sense circuit having a load circuit, an N-channel transistor, a plurality of input ends and a plurality of output ends. An output from each of the plurality of second pre-sense circuits and an output from the third pre-sense circuit are input to the sense amplifier.

In one embodiment of the invention, the load circuit of each of the plurality of second pre-sense circuits of the reference voltage generation circuit is a P-channel transistor, and the load circuit of the fourth pre-sense circuit is a P-channel transistor. A gate electrode and a drain electrode of one of the plurality of second pre-sense circuits are connected to a gate electrode of the P-channel transistor of the fourth pre-sense circuit, so that a load characteristic of the fourth pre-sense circuit is equal to a load characteristic of the one of the plurality of second pre-sense circuits.

In one embodiment of the invention, the reference voltage generation circuit shortcircuits an output from the fourth pre-sense circuit and an output from the one of the plurality of second pre-sense circuits through a transistor, and the output from the fourth pre-sense circuit and the output from the one of the plurality of second pre-sense circuits are transferred to a respective prescribed potential from the same level after being released from the shortcircuiting.

In one embodiment of the invention, the memory reading circuit further includes a load circuit for performing current-to-voltage conversion of the selected memory cell and the reference cell, the load circuit including at least one of a transistor and a resistor, wherein the load circuit is directly connected to a drain electrode of the selected memory cell and the drain electrode of the reference cell.

In one embodiment of the invention, a memory reading circuit for a semiconductor memory device for reading information from a selected memory cell by supplying a reference voltage to one of two input ends of a sense amplifier and supplying a voltage from the selected memory cell to the other of the two input ends is provided. The memory reading circuit includes a reference voltage generation circuit described above; a third pre-sense circuit connected to the selected memory cell and having an N-channel transistor, a P-channel transistor, a plurality of input ends and a plurality of output ends; and a fourth pre-sense circuit for receiving an output from the third pre-sense circuit, the fourth pre-sense circuit having a load circuit, an N-channel transistor, a plurality of input ends and a plurality of output ends. An output from each of the plurality of second pre-sense circuits and an output from the third pre-sense circuit are input to the sense amplifier.

In one embodiment of the invention, the load circuit of each of the plurality of second pre-sense circuits of the reference voltage generation circuit is a P-channel transistor, and the load circuit of the fourth pre-sense circuit is a P-channel transistor. A gate electrode and a drain electrode of one of the plurality of second pre-sense circuits are connected to a gate electrode of the P-channel transistor of the fourth pre-sense circuit, so that a load characteristic of the fourth pre-sense circuit is equal to a load characteristic of the one of the plurality of second pre-sense circuits.

In one embodiment of the invention, the reference voltage generation circuit shortcircuits an output from the fourth pre-sense circuit and an output from the one of the plurality of second pre-sense circuits through a transistor, and the output from the fourth pre-sense circuit and the output from the one of the plurality of second pre-sense circuits are transferred to a respective prescribed potential from the same level after being released from the shortcircuiting.

In one embodiment of the invention, the memory reading circuit further includes a load circuit for performing current-to-voltage conversion of the selected memory cell and the reference cell, the load circuit including at least one of a transistor and a resistor, wherein the load circuit is directly connected to a drain electrode of the selected memory cell and the drain electrode of the reference cell.

According to another aspect of the invention, an electronic information device capable of reading information uses a memory reading circuit described above.

According to another aspect of the invention, an electronic information device capable of reading information uses a reference voltage generation circuit described above.

Thus, the invention described herein makes possible the advantages of providing a reference voltage generation circuit, used for a semiconductor memory device, for generating a plurality of reference voltages having reduced timewise delay so that when one reference cell is connected to the plurality of comparator circuits, a plurality of comparator circuits are simultaneously operated with reduced influence caused by a coupling effect; a memory reading circuit including such a reference voltage generation circuit; and an electronic information device using such a memory reading circuit.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1:
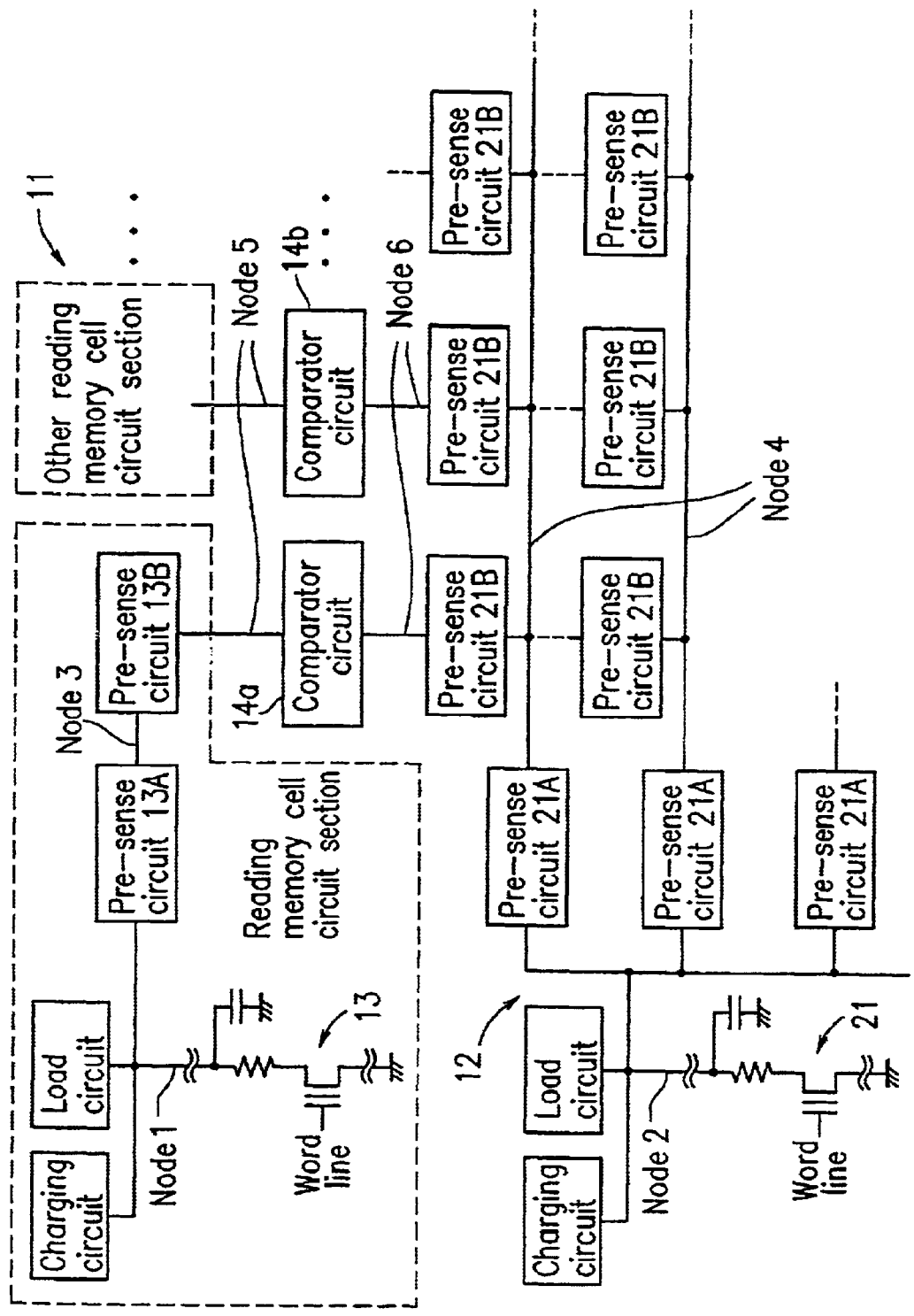
FIG. 1 is a block diagram illustrating a partial structure of a memory reading circuit for a semiconductor memory device according to an example of the present invention.

FIG. 1 is a partial block diagram of a memory reading circuit 11 in a semiconductor memory device according to an example of the present invention.

As shown in FIG. 1, the memory reading circuit 11 includes a reference voltage generation circuit 12 for supplying a reference voltage, a pre-sense circuit 13A as a third pre-sense circuit having an input end connected to a reading memory cell 13 and an output end, a pre-sense circuit 13B as a fourth pre-sense circuit having an input end for receiving an output from the corresponding pre-sense circuit 13A and an output end, and comparator circuits 14 as sense amplification means for receiving an output from the pre-sense circuit 13B and making a determination regarding memory information reading.

The reference voltage generation circuit 12 includes a reference cell 21 having a source electrode and a drain electrode, a plurality of pre-sense circuits 21A as first pre-sense circuits each having an input end connected to the reference cell 21 and an output end, and a plurality of pre-sense circuits 21B as second pre-sense circuits each having an input end for receiving an output from each pre-sense circuit 21A and an output end.

The reference cell 21 has a structure in which the source electrode and the control gate electrode have voltage characteristics equivalent to the those of the memory cell 13. A drain electrode of the reference cell 21 is connected to a line connected to an output node 2 (hereinafter, referred to as a "reference output line") via a transistor having a current providing capability equivalent to that of the selection transistor connected to a drain electrode of the reading memory cell 13. The reference output line is connected to a load circuit, a charging circuit and a plurality of pre-sense circuits 21A. The current amount provided by the reference cell 21 has a level between the current amount flowing in the program cell and the current amount flowing in the erase cell under the bias conditions similar to those of the reading memory cell 13.

The reading memory cell 13 has a source electrode which is grounded via a transistor or the like. A control gate electrode of the reading memory cell 13 receives a signal obtained by decoding a generally known address signal via a word line. A drain electrode of the reading memory cell 13 is connected to a line connected to an output node 1 (hereinafter, referred to as a "bit output line") via a selected transistor or the like selected by the signal obtained by decoding the address signal. The bit output line is connected to a load circuit, a charging circuit and the pre-sense circuits 13A of the reading memory cell 13. Here, a method for selecting a memory cell from which information is to be read among memory cells in a memory array and the detailed configuration of a circuit used for the selection will not be described in detail.

The pre-sense circuit 13A and the pre-sense circuit 13B of the reading memory cell 13 are connected to each other.

Each of the plurality of pre-sense circuits 21A connected to the reference cell 21 is connected to the plurality of pre-sense circuits 21B.

The pre-sense circuit 13A and the pre-sense circuits 21A have the same structure. The pre-sense circuit 13B and the pre-sense circuits 21B have the same structure.

One of the comparator circuits 14 (represented by reference numeral 14a in FIG. 1) receives an output from the pre-sense circuit 13B connected to the reading memory cell 13 and an output from one of the pre-sense circuits 21B connected to the reference cell 21 via one of the pre-sense circuits 21A. These outputs are used as memory information read from the reading memory cell 13. The other comparator circuits 14 (represented by reference numeral 14b) each receive an output from a pre-sense circuit 13B connected to another reading memory cell and an output from another one of the pre-sense circuits 21B connected to the reference cell 21 via another of the pre-sense circuits 21A. Thus, the comparator circuits 14 each output information from the corresponding reading memory cell. The charging circuits and the comparator circuits 14 may receive a signal obtained based on a signal generated by an ATD circuit (address transfer detection circuit) or the like and controlled with respect to the operating period.

Figure 2:
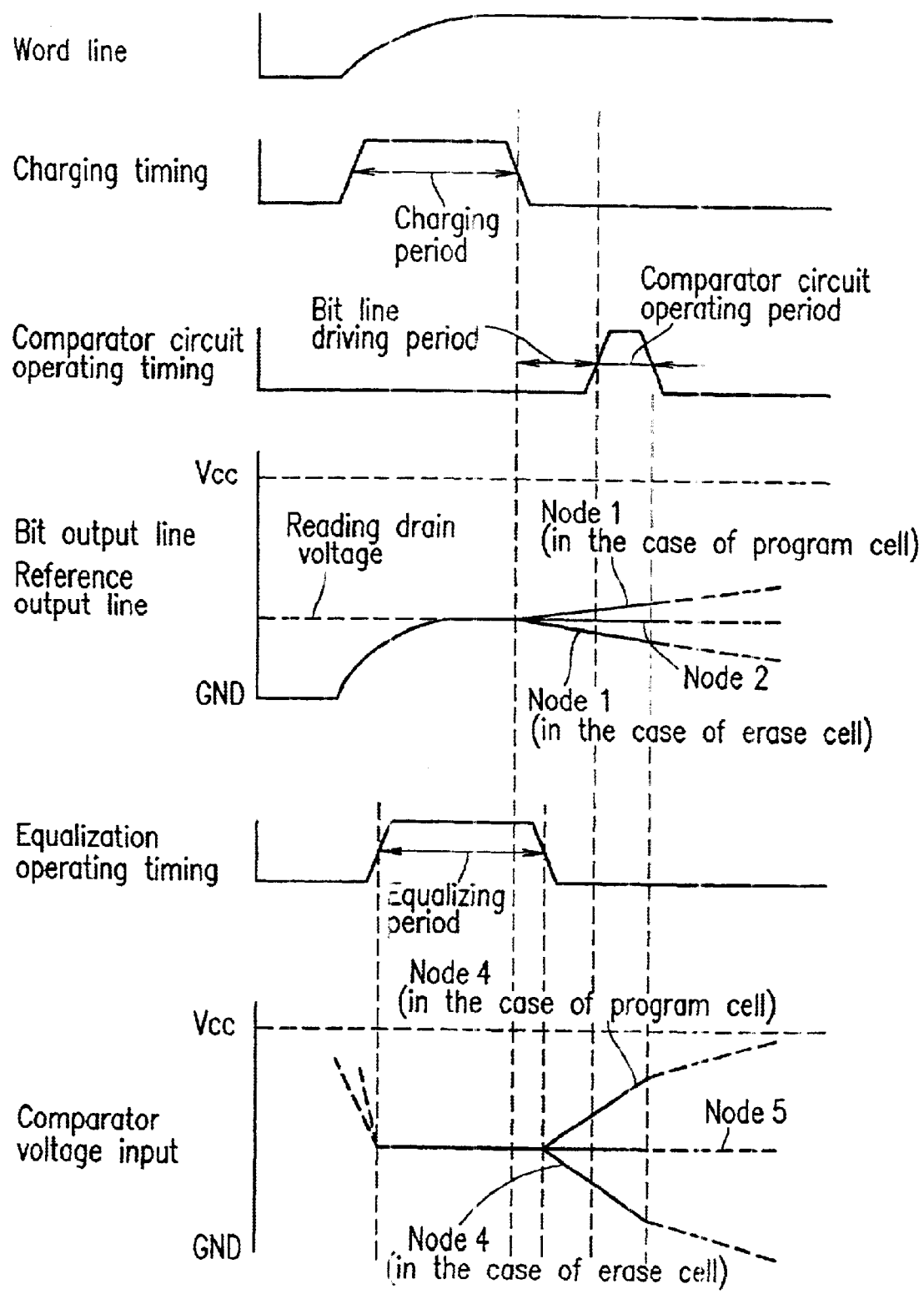
FIG. 2 is a timing diagram illustrating the reading operating timing and the node voltages of the memory reading circuit shown in FIG. 1.

With reference to FIG. 2, the timing regarding signal voltages in the section shown in FIG. 1 will be described. As shown in FIG. 2, a data reading operation from the reading memory cell 13 includes a charging period, a bit line driving period, and a comparator circuit operating period.

During the charging period, the output nodes 1 and 2 (FIG. 1) are charged by the charging circuit until the drain electrode of the reading memory cell 13 and the drain electrode of the reference cell 21 both reach a reading drain voltage.

Next, the operation during the bit line driving period will be described. When the charging period of charging the output nodes 1 and 2 is completed, the operation goes into the bit line driving period. The signal voltage of the output nodes 1 and 2 obtain a waveform shown in FIG. 2 by the current characteristics of the load circuits (FIG. 1) connected both to the reading memory cell 13 and the reference cell 21 and by the current characteristics of the reading memory cell 13 and the reference cell 21.

In the example shown in FIG. 2, the current characteristics of the reference cell 21 are equal to the current characteristics of the load circuits, and these characteristics do not change even after the charging period is over. When the load circuits have such current characteristics, in the program cell, the voltage of the output node 1 changes to be higher than the voltage of the output node 2. In the erase cell, the voltage of the output node 1 changes to be lower than the voltage of the output node 2. The voltages of both the output nodes 1 and 2 slowly change due to load capacitances or resistances in the memory array until being stabilized by the load circuit and the charging circuit.

Hereinafter, specific structures of the bit output line, the reference output line, and the pre-sense circuits A (including 13A and 21A) and B (including 13B and 21B) will be described.

Figure 3:
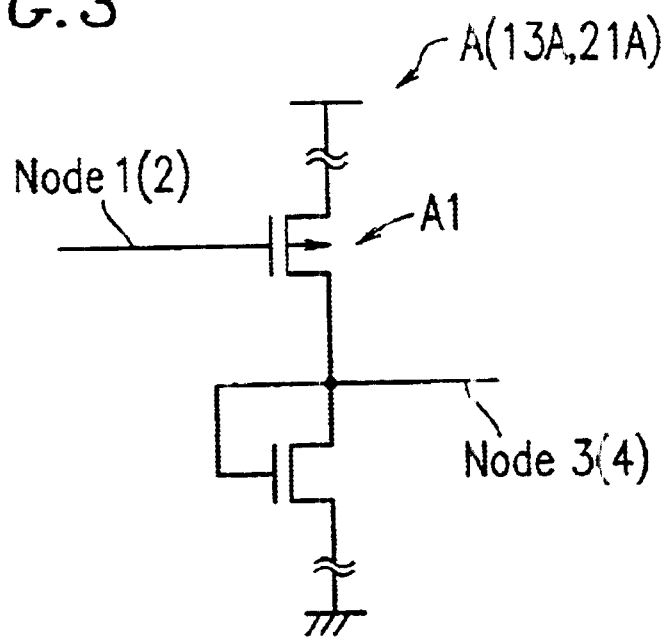
FIG. 3 is a circuit diagram of a pre-sense circuit B (13B, 21B) shown in FIG. 1.
Figure 4:
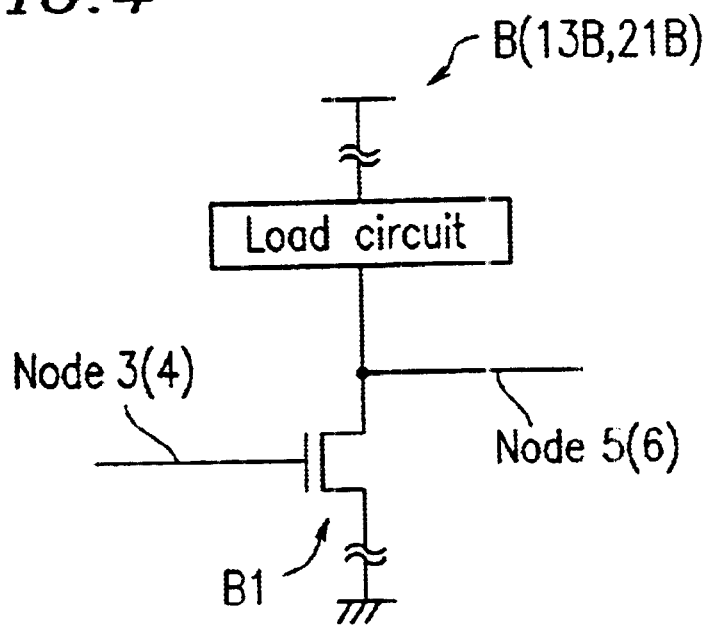
FIG. 4 is a circuit diagram of a pre-sense circuit B (13B, 21B) shown in FIG. 1.

FIG. 3 is a circuit configuration of the pre-sense circuit A (including 13A and 21A) shown in FIG. 1, and FIG. 4 is a circuit configuration of the pre-sense circuit B (including 13B and 21B) shown in FIG. 1.

The drain electrode of the reading memory cell 13 (FIG. 1) is connected to the node 1 as an input end of the pre-sense circuit A through the selection transistor. A bit output line connected to a load circuit (FIG. 1) is also connected to the node 1 as the input end of the pre-sense circuit A. A node 3 or 4 (FIG. 3) as an output end of the pre-sense circuit A is connected to a node 3 or 4 (FIG. 4) as an input end of the pre-sense circuit B. A node 5 or 6 (FIG. 4) as an output end of the pre-sense circuit B is connected to an input end of the comparator circuit 14.

The bit output line connected to the node 1 is connected to the pre-sense circuit A as described above. The bit output line is connected to the gate electrode of a transistor A1 in the pre-sense circuit A which is connected to the reading memory cell 13. The reference output line connected to the node 2 is connected to the plurality of pre-sense circuit A as described above. The reference output line is connected to the gate electrode of a transistor A1 in each of the plurality of pre-sense circuits A which are connected to the reference cell 21. The number of the pre-sense circuits A connected to the reference output line is such that the number does not influence the characteristics of the nodes 4, i.e., such that the number does not reduce the speed of the reading operation of the comparator circuit 14 described below. Since the same gate electrode voltage is input to the same circuit, the plurality of pre-sense circuits A connected to the reference cell 21 all output, to the nodes 4, signals having voltages which vary in accordance with time in the same manner.

Next, the voltage at the node 3 is input to the gate electrode in the pre-sense circuit 13B connected to the reading memory cell 13, and the voltage at the node on the side of the output of the pre-sense circuit 13B is input to the comparator circuit 14a. Similarly, the voltage at the plurality of nodes 4 are respectively input to transistors B1 (FIG. 4) in the plurality of reference cells 21. Thus, the plurality of pre-sense circuits 21B output a voltage to be sent to the nodes 6.

The voltage at the nodes 4 are input to the plurality of pre-sense circuits 21B. The number of the pre-sense circuits 21B is such that the number does not influence the characteristics of the nodes 6; i.e., such that the number does not reduce the speed of the reading operation of the comparator circuit 14 like in the case of the pre-sense circuit 13B connected to the reading memory cell 13.

As a result, the plurality of pre-sense circuits 21B on the side of the reference cell 21 all output, to the nodes 6, signals having voltages which vary in accordance with time in the same manner. These signals are respectively input to the comparator circuits 14 which are connected to different reading memory cells. Each of these outputs from the pre-sense circuits 21B is sufficiently small to allow the influence caused by the coupling effect to be ignored. Namely, the outputs from the pre-sense circuits 21B having a common level can be input to the plurality of comparator circuits 14 as long as the voltage characteristics of the comparator circuits 14 with respect to time is not influenced by such an input. The voltages of the plurality of nodes 6 vary in the same manner timewise.

Returning to FIG. 2, the comparator operating period will be described. In the comparator operating period, each comparator circuit 14 operates so as to detect whether the output voltage to the node 5 is higher or lower than the reference voltage, which is the output voltage to the node 6. Finally, information read from the reading memory cell 13 is obtained as the output from the comparator circuit 14. In the example shown in FIG. 2, the comparator circuit 14 operates in a certain time period. Alternatively, the comparator circuit 14 maybe constantly operated or operated from the start of the bit line driving period.

Hereinafter, more specific examples of the pre-sense circuits A (including 13A and 21A), the pre-sense circuits B (including 13B and 21B), and the comparator circuit 14 according to the present invention will be described.

Figure 5:
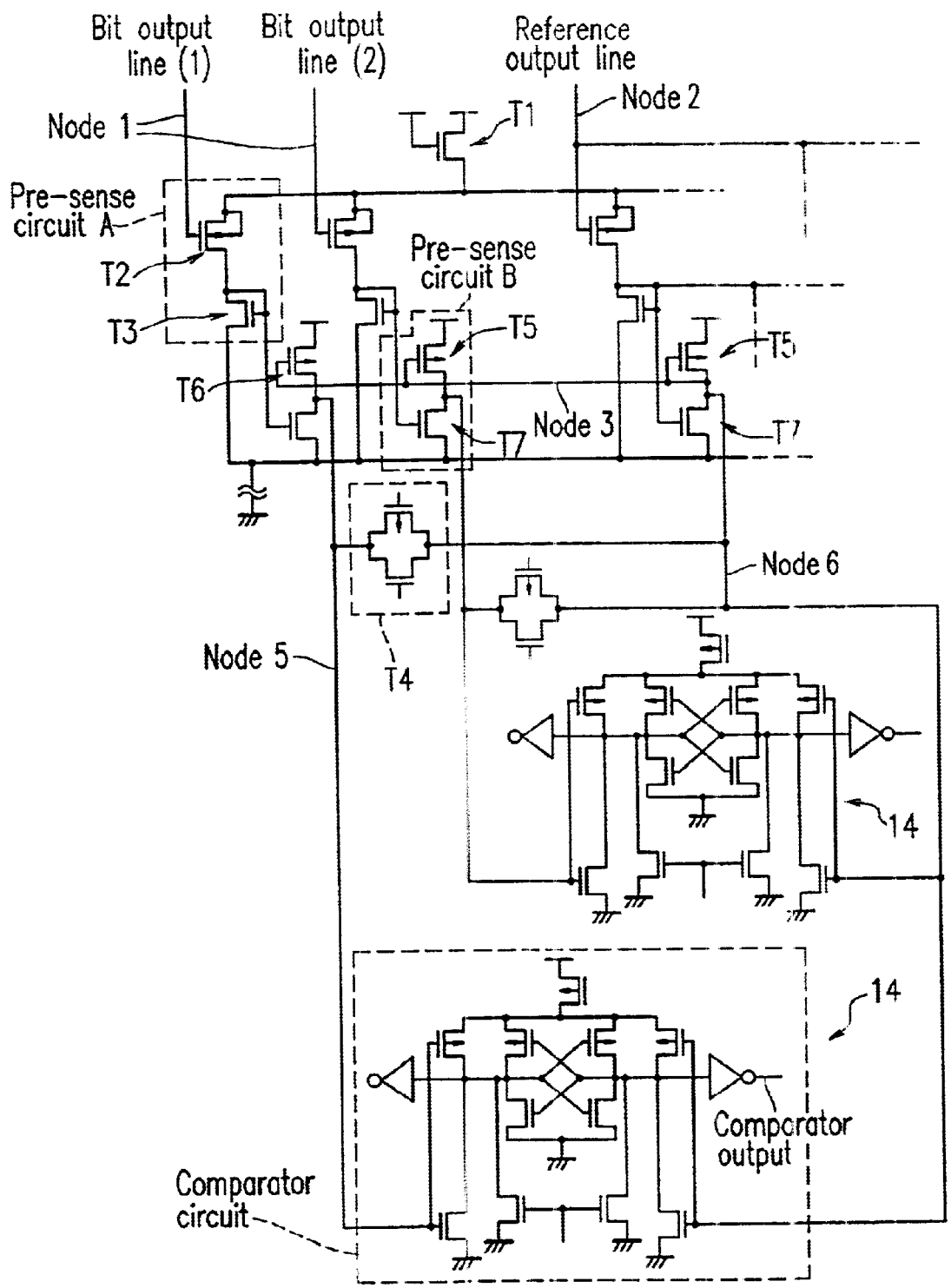
FIG. 5 is a circuit diagram illustrating specific structures of a bit output line, a reference output line, pre-sense circuits and comparator circuits of a reading memory circuit according to the present invention.

FIG. 5 shows an example of the structure of the load circuits, connection between the comparator circuit 14, the reading memory cell 13 and the reference cell 21, and the structure of the comparator circuits 14. The comparator circuit 14 shown here is obtained by modifying the circuit disclosed by Japanese Laid-Open Publication No. 11-306782.

In the example shown in FIG. 5, one pre-sense circuit B on the side of the reference cell 21 is connected to 2 bits of comparator circuits 14, i.e., two reading memory cells 13 or the comparator circuit 14. FIG. 5 does not show in detail the connection between the comparator circuit 14 and the plurality of pre-sense circuits B on the side of the reference cell 21 shown in FIG. 1, for the sake of simplicity. A bit output line is connected to the node 1, and a reference output line is connected to the node 2. Bit lines (1) and (2) are respectively connected to different reading memory cells.

The reading drain voltage of the bit output line and the reading drain voltage of the reference output line cannot be very high as described above. The upper limit for the voltage is defined as, for example, 1 V. Where the supply voltage of the circuit shown in FIG. 5 is 3 V, a transistor T1 or the like may be provided so as to reduce the source voltage of a transistor T2 in the pre-sense circuit A. This is performed so that the transistor T2 (P-channel or Pch transistor) is operated in an operating region of a pentode where the voltages of the bit output line and the reference output line have upper limits. A transistor T3 in the pre-sense circuit A (N-channel or Nch transistor) is provided with a current providing ability so that the transistor T2 (Pch transistor) is operated in the pentode region.

Figure 6:
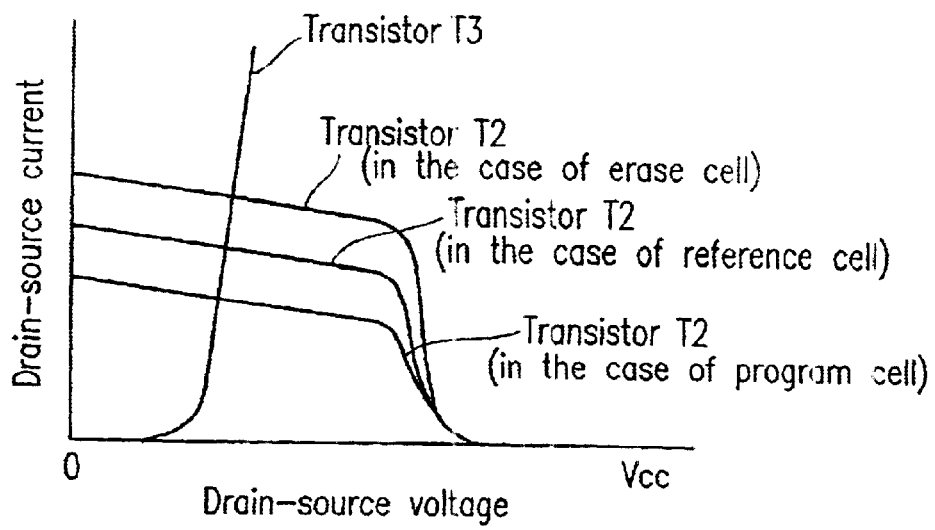
FIG. 6 is a graph illustrating the voltage vs. current characteristics of the pre-sense circuit A (13A, 21A) according to the present invention.

FIG. 6 shows exemplary voltage vs. current curves of the elements in the pre-sense circuit A shown in FIG. 5. The output voltage of the pre-sense circuit A in FIG. 5 is the intersection between the curve of the transistor T2 of each of the program cell, the reference cell and the erase cell, and the transistor T3. When the transistor T2 operates in the pentode region, the transistor T1 may be omitted in the case where, for example, the supply voltage is 2 V.

In the circuit shown in FIG. 5, a Pch transistor is used as a load circuit for the pre-sense circuit B on the side of the reference cell 21. The load circuit formed of the Pch transistor is connected as indicated by node 3 in FIG. 5 in order to obtain the characteristics of the load circuit connected to the reading memory cell 13. By such a connection, even when the difference between the voltage of the bit output line at the input end of the comparator circuit 14 and the voltage of the reference output line at the input end of the comparator circuit 14 is changed in accordance with the supply voltage outside the chip, the operating point of the load circuit follows the change.

However, when the connection indicated by node 3 in FIG. 5 is made, the node 5 and the node 6 for the pre-sense circuit B in FIG. 5 are not well balanced in terms of line capacitance, and as a result, a stable operation of the pre-sense circuit B is prevented. In order to solve this inconvenience, a transistor T4 is provided as shown in FIG. 5. Thus, the initial value of the voltage which is input to the comparator circuit becomes the same on the side of the reference cell 21 and on the side of the reading memory cell 13. Thus, a high speed operation of the comparator circuit 14 is realized.

The operation of the transistor T4 in FIG. 5 will be referred to as an "equalization operation" of the input voltage to the comparator circuit 14. The timing of the equalization operation of the input voltage to the comparator circuit 14 is as shown in FIG. 2. The timing of the equalization operation maybe the same as the charging timing shown in FIG. 2.

Figure 7:
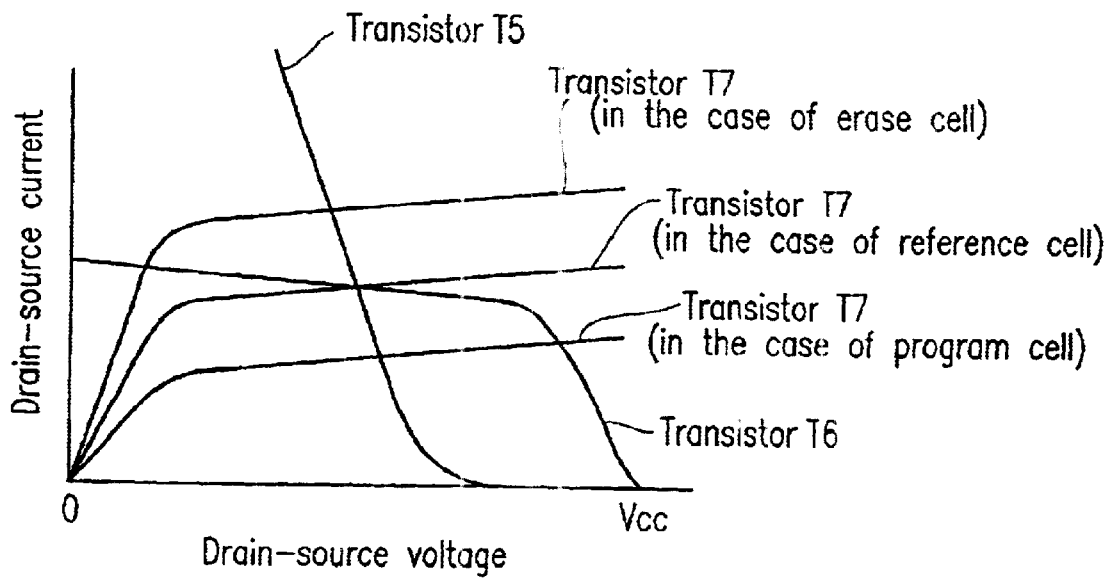
FIG. 7 is a graph illustrating the voltage vs. current characteristics of the pre-sense circuit B (13B, 21B) according to the present invention.

The voltage vs. current characteristics of the elements in the pre-sense circuit A shown in FIG. 5 results in the voltage vs. current characteristics of the elements in the pre-sense circuit B shown in FIG. 7 by the pre-sense circuit B in FIG. 5. As a result, the elements in the pre-sense circuit A obtains the comparator input voltage in accordance with the voltage vs. current characteristics of the elements in the pre-sense circuit B.

FIG. 7 shows exemplary voltage vs. current curves of transistors T5, T6 and T7 shown in FIG. 5. The comparator input voltage on the side of the reference cell 21 is at the intersection of the curves of the transistors T5 and T7, and the comparator input voltage on the side of the reading memory cell 13 is at the intersection of the curves of the transistors T6 and T7.

As can be appreciated from FIG. 7, the comparator input voltage characteristics are determined based on the load circuit characteristics for the pre-sense circuit B in FIG. 5. In order to reduce the area and the operating current of the chip, the transistor T7 (Nch transistor) for the pre-sense circuit B in FIG. 5 need not have the same size and the same current providing capability as those of the transistor T3 (Nch transistor) for the pre-sense circuit A in FIG. 5. The transistor T5 (Pch transistor) for the pre-sense circuit B in FIG. 5 need not have the same size and the same current providing capability as those of the transistor T2 (Pch transistor) for the pre-sense circuit A in FIG. 5.

As described above, a reading memory circuit includes a reference cell 21, a plurality of pre-sense circuits 21A each having an input end connected to the reference cell 21 and an output end, a plurality of pre-sense circuits 21B each having an input end connected to the output of the pre-sense circuit 21A and an output end, and a plurality of comparator circuits 14. An output from the pre-sense circuit 21B on the side of the reference cell 21 and an output from the pre-sense circuit 13B on the side of the reading memory cell 13 are both input to each comparator circuit 14. Due to such a structure, a plurality of reference voltages can be generated in order to operate a plurality of comparator circuits 14 by a small number of reference cells 21. Therefore, the area of the entire chip can be reduced. Since the entire chip requires only a small number of reference cells 21, the steps required for placing the reference cells 21 into a preferable state is shorter than that of a chip including a larger number of reference cells. Since the pre-sense circuits A and B are provided, the conventional current detection circuit can be eliminated, and the load circuit can be directly connected to the drain electrode of the reading memory cell 13 via the selection transistor. Due to the structure of the present invention, the difference of the voltages input to the comparator circuit 14 is increased, and as a result, a high speed operation of the comparator circuit 14 is realized. Namely, the time period required to access the reading memory cell 13 to read information therefrom is shortened.

Figure 8:
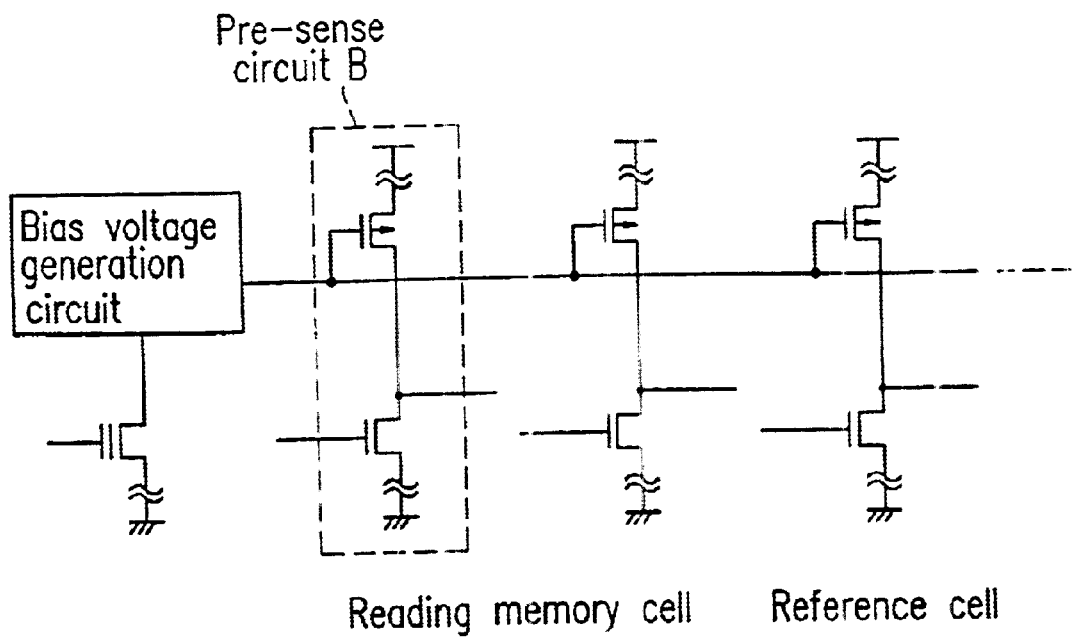
FIG. 8 is a circuit diagram illustrating another structure of the pre-sense circuit B (13B, 21B) according to the present invention.
Figure 9:
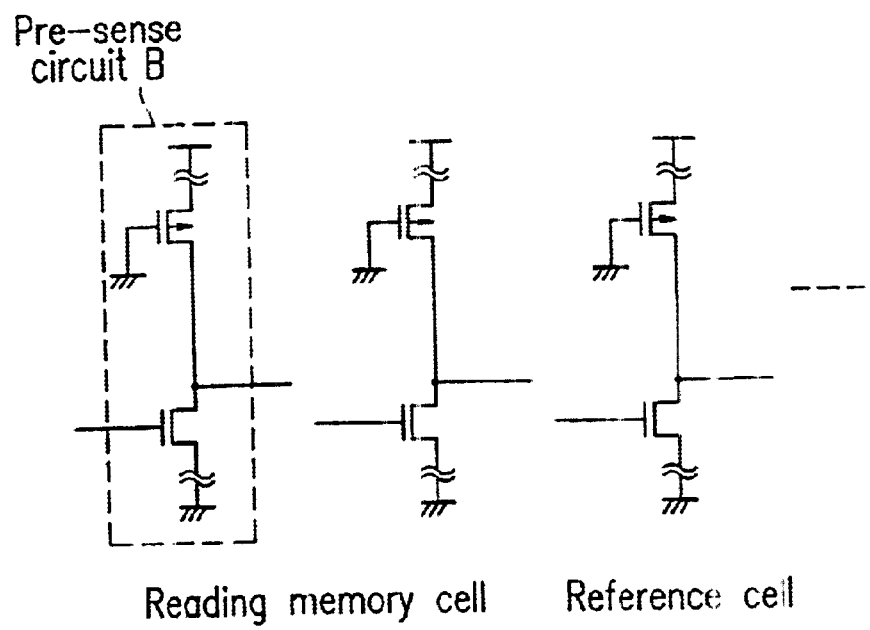
FIG. 9 is a circuit diagram illustrating still another structure of the pre-sense circuit B (13B, 21B) according to the present invention.

As shown in FIG. 8, the above-described load circuit for the pre-sense circuit B may include a bias voltage generation circuit using a memory cell such as a reference cell. In the case where the supply voltage in FIG. 5 cannot reach a prescribed voltage by a constant voltage circuit or a sufficient input voltage is guaranteed for the comparator circuit 14, Pch transistors having the same performance as each other may be used as loads (FIG. 9), or a combination of a resistor and an Nch transistor may be used as a load.

The node 5 (comparator input bit line) and the node 6 (comparator input reference line) are connected to the comparator circuit 14 shown in FIG. 5, and may be operated at the operating timing of the comparator circuit 14 shown in FIG. 2.

Figure 10:
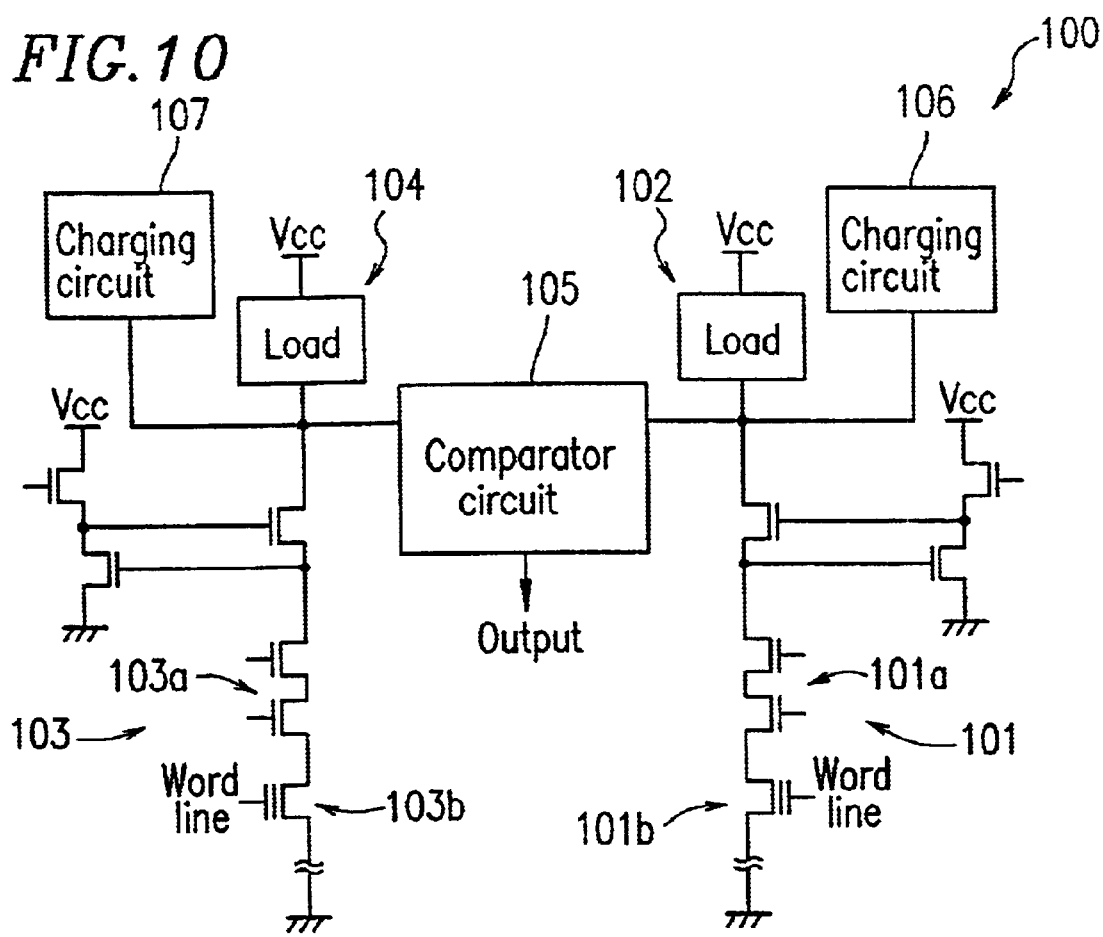
FIG. 10 is a circuit diagram illustrating a sense amplifier circuit and circuits related thereto in a conventional flash memory.
Figure 11:
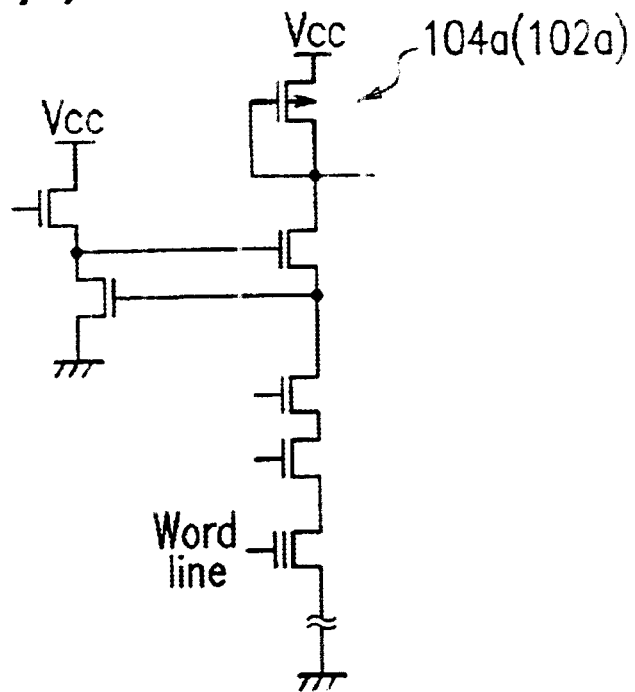
FIG. 11 is a circuit diagram illustrating an example of a load circuit usable for the sense amplifier circuit shown in FIG. 10.
Figure 12:
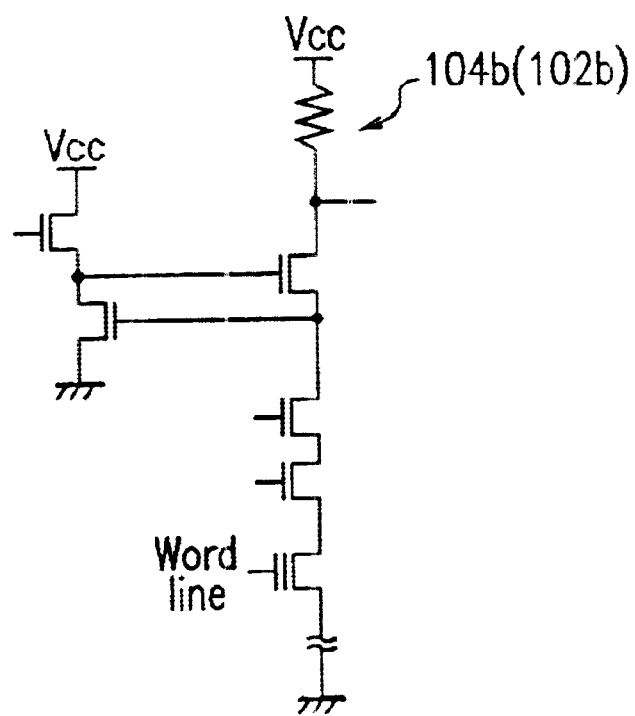
FIG. 12 is a circuit diagram illustrating another example of a load circuit usable for the sense amplifier circuit shown in FIG. 10.
Figure 13:
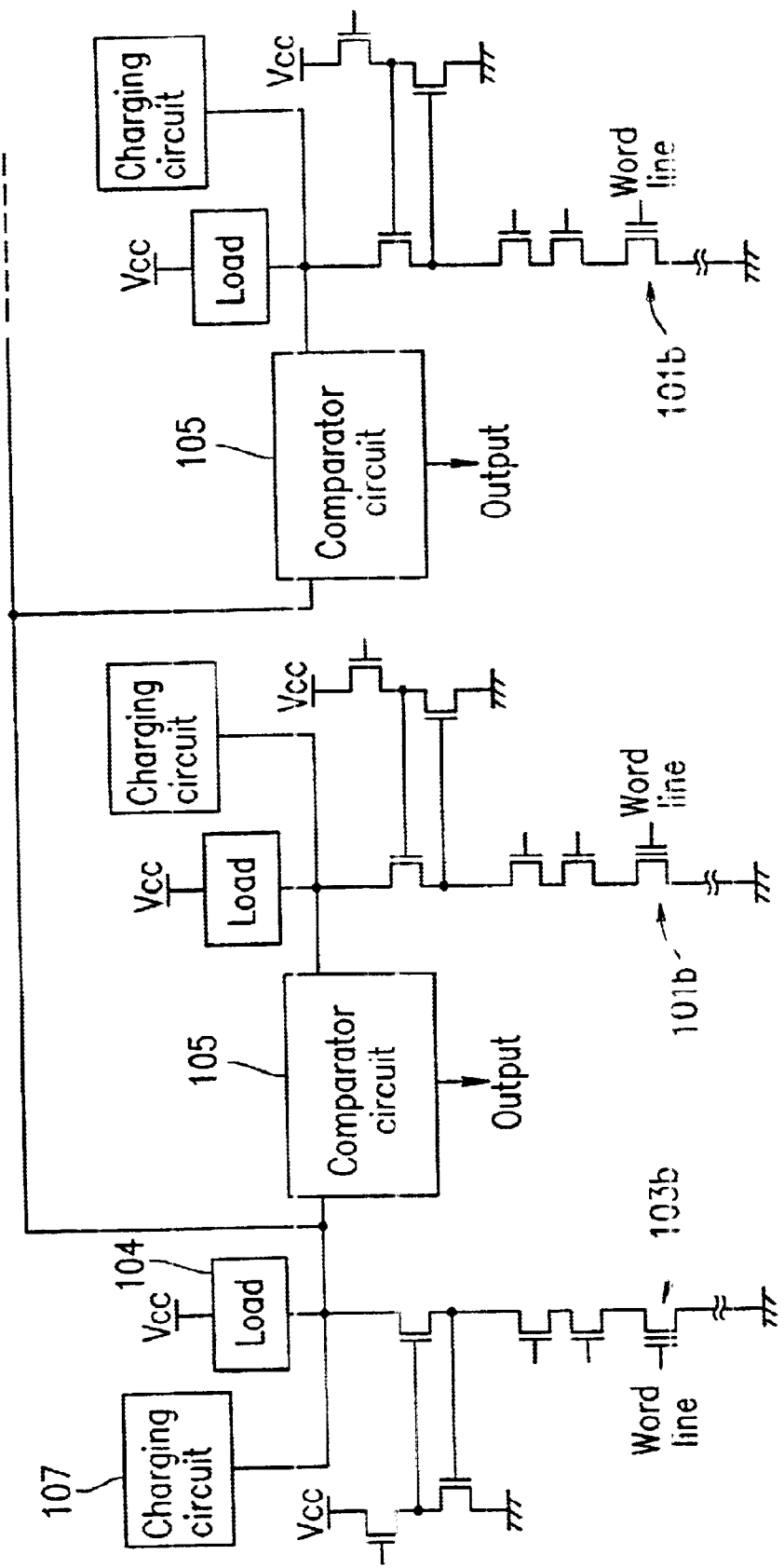
FIG. 13 is a circuit diagram illustrating a manner of connecting a plurality of comparator circuits in the sense amplifier circuit shown in FIG. 10.
Figure 14:
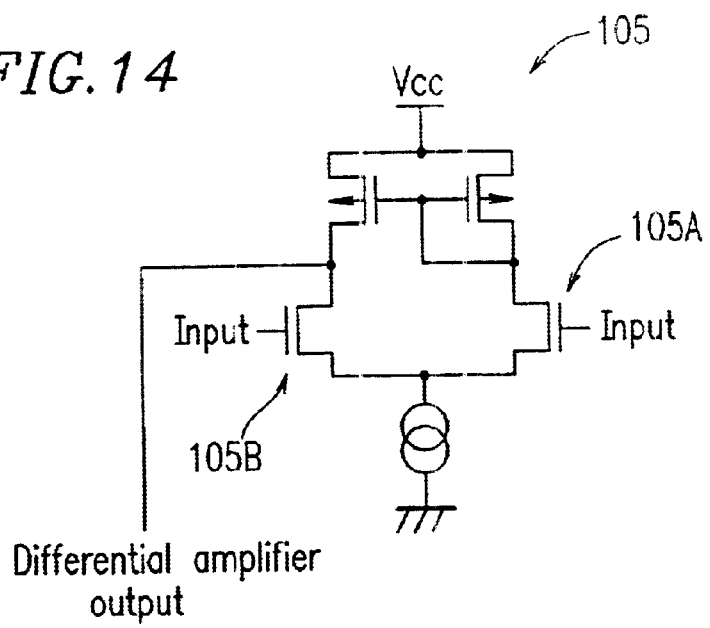
FIG. 14 is a circuit diagram illustrating an example of a comparator circuit in the sense amplifier circuit shown in FIG. 10.
Figure 15:
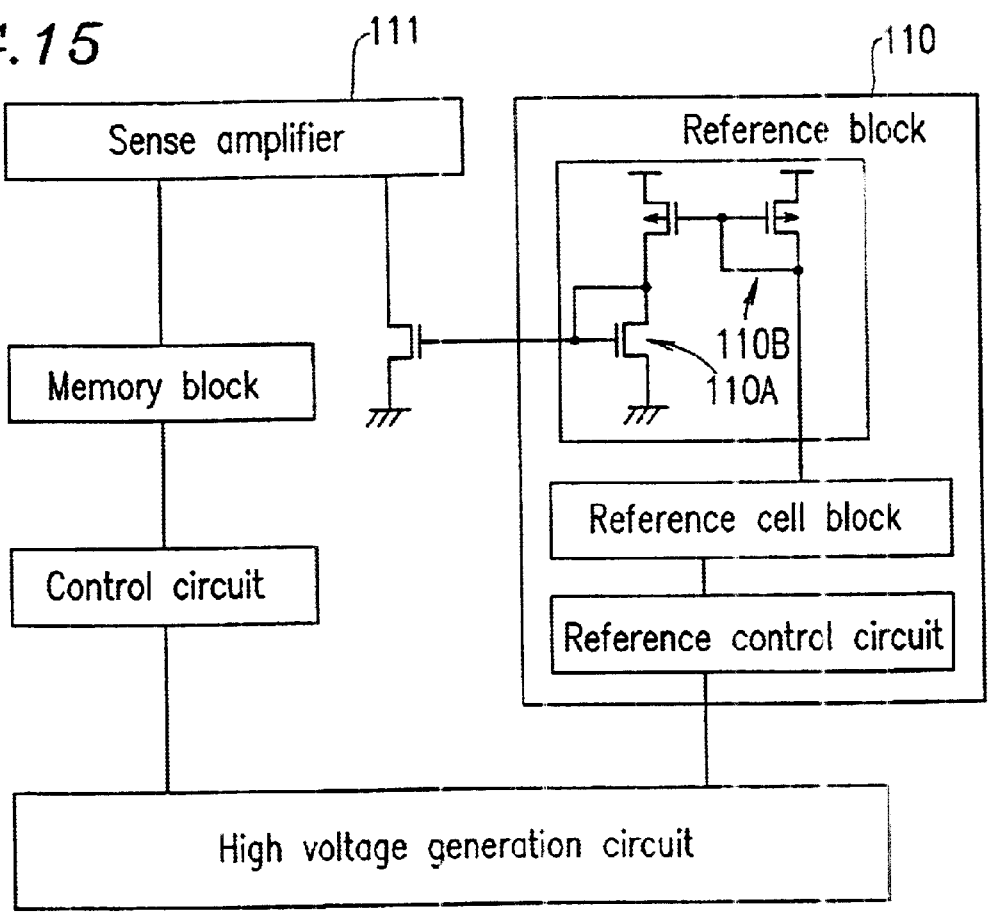
FIG. 15 is a block diagram illustrating a conventional reference voltage generation circuit and a conventional exemplary sense amplifier circuit.
Figure 16:
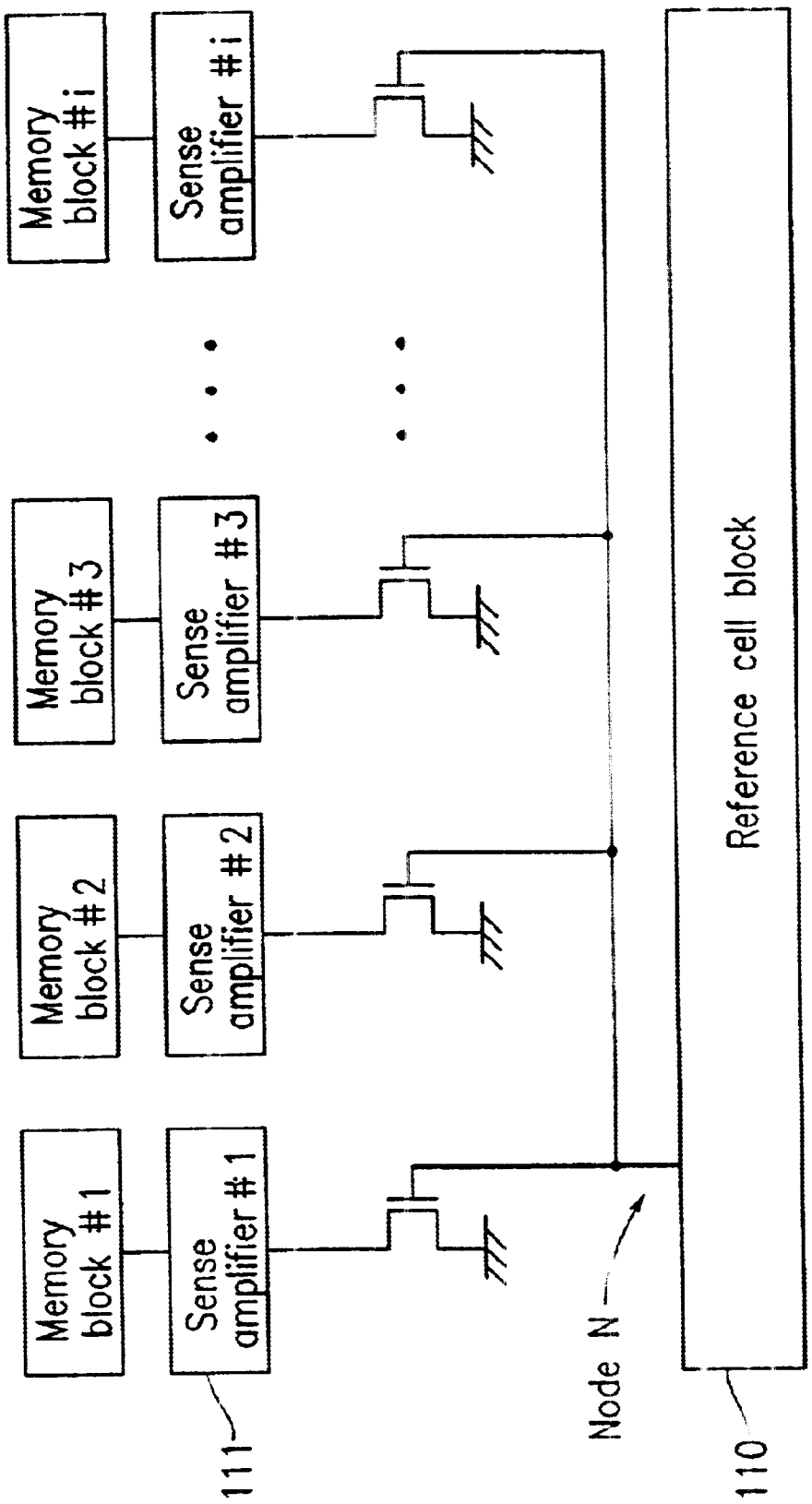
FIG. 16 is a block diagram illustrating an exemplary manner of connecting the reference voltage generation circuit and the sense amplifier circuit shown in FIG. 15.
Figure 18:
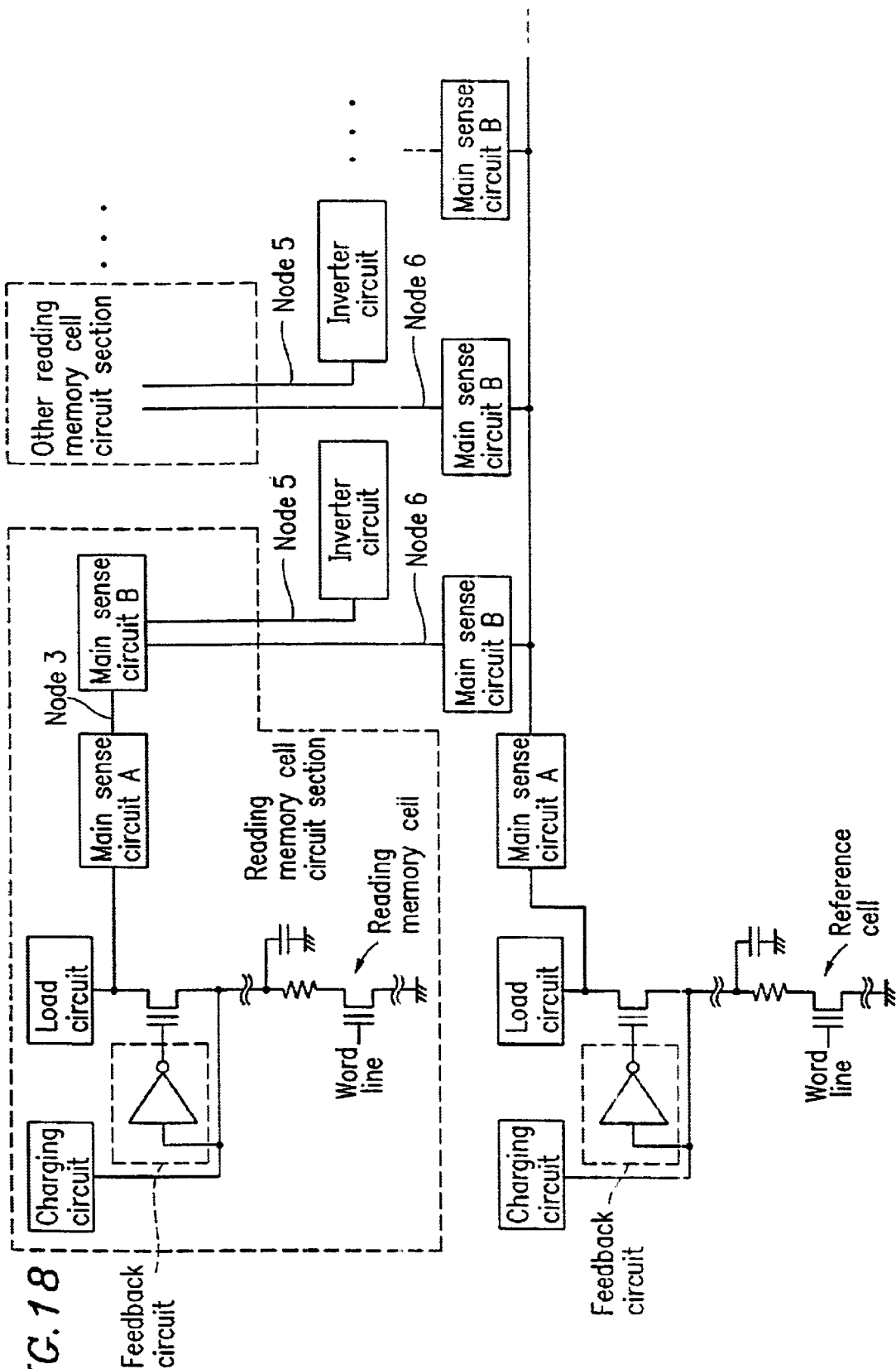
FIG. 18 is a block diagram illustrating another structure of a memory reading circuit for a semiconductor memory device according to the present invention.
Figure 19:
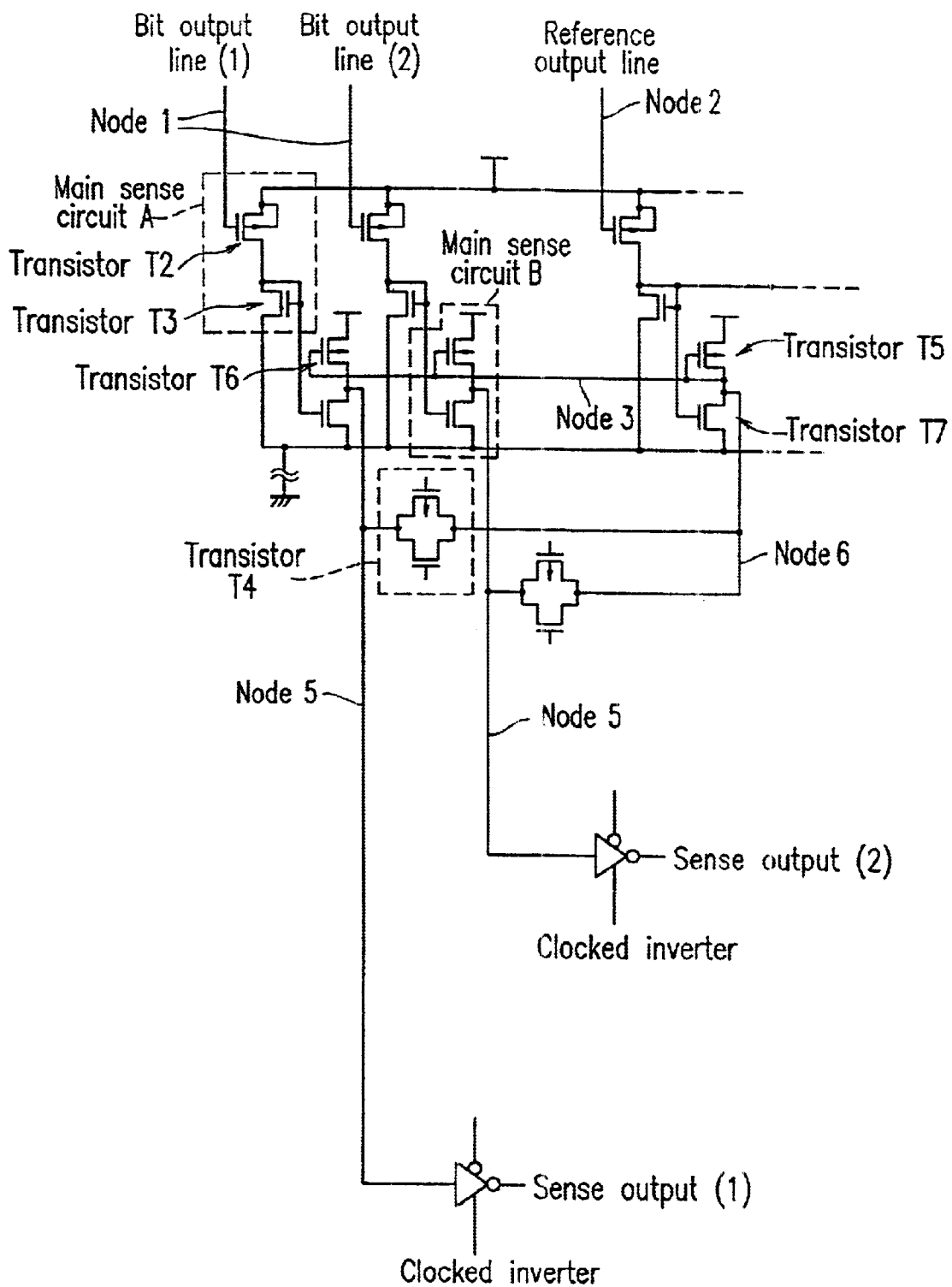
FIG. 19 shows a specific example of the circuit configuration shown in FIG. 18.

The comparator circuit 14 need not have the structure shown in FIG. 5, and may be a generally known differential amplifier. A circuit section including the memory cell for obtaining the signal from the bit output line may include a known feedback-type current detection circuit shown in FIG. 10. FIG. 18 shows an example of connection. In the example shown in FIG. 18, since a feedback-type circuit (basic circuit) is provided, a sufficient amplitude is obtained by a pre-sense amplifier. In this case, the above-described pre-sense A is shown as a main sense circuit A, and the above-described pre-sense B is shown as a main sense circuit B. A specific example of the main sense circuit A is the circuit shown in FIG. 3, and a specific example of the main sense circuit B is the circuit shown in FIG. 4. In the example of FIG. 18, the node 5 obtains a sufficient amplitude by a reading operation and thus the comparator circuits shown in FIG. 1 are not necessary. Here, the node 5 at an output end of the main sense circuit B on the side of the memory cell is directly connected to an input end of an inverter circuit. FIG. 19 shows a specific example of the circuit configuration shown in FIG. 18. The feedback circuit shown in FIG. 1 is included, and therefore the Nch transistors shown in FIG. 5 are not necessary. A sufficient amplitude is obtained by the pre-sense circuits A and the pre-sense circuits B. In FIGS. 18 and 19, clocked inverter circuits (inverter circuits) are provided instead of the comparator circuits shown in FIG. 1. In this specification, the pre-sense circuits and the main sense circuits are collectively referred to as sense circuits (sense amplifier circuits).

The present invention has been described by way of specific examples, which are not limiting. Upon reading the specification, those skilled in the art would understand that the above-described examples may be variously modified and there are other embodiments and examples. The scope of the present invention encompasses these various modifications, embodiments and examples.

The reference voltage generation circuit 12 may be operated as follows. An output from the pre-sense circuit B connected to the reading memory cell 13 and an output from the pre-sense circuit B connected to the reference cell 21 are shortcircuited for a certain time period. These out put scan be transferred to the respective prescribed potentials from the same level after being released from the shortcircuited state.

Figure 17:
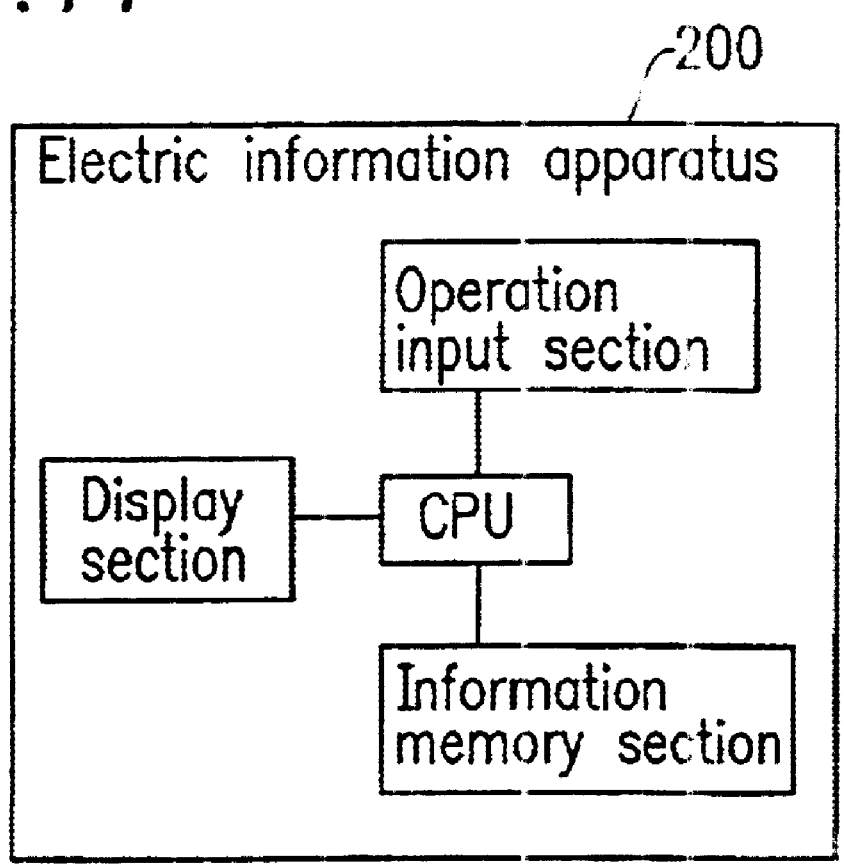
FIG. 17 is a block diagram illustrating an electronic information device including a reference voltage generation circuit and a memory reading circuit for a semiconductor memory device according to the present invention.

In the above example, a reference voltage generation circuit for a semiconductor memory device and a memory reading circuit including the reference voltage generation circuit are described. A reference voltage generation circuit and a memory reading circuit according to the present invention can be easily incorporated into an electronic information device such as, for example, a cellular phone or a computer so as to provide the effect of the present invention. For example, as shown in FIG. 17, an electronic information device 200 can include an information memory section such as, for example, a RAM or a ROM, an operation input section, a display section for displaying an initial screen or an information processing result, such as, for example, a liquid crystal display device, and a CPU (central processing unit). The CPU performs various types of information processing by reading information from or writing information to the information memory section (memory operation), upon receiving an instruction from the operation input section, based on a prescribed information processing program or data thereof. In this case, the reference voltage generation circuit and the memory reading circuit according to the present invention can be easily used in the information memory section.

According to the present invention, a plurality of reference voltages can be generated so as to have a reduced timewise delay, from at least one reference cell, and therefore, a plurality of sense amplifier circuits (for example, comparator circuits) can be simultaneously operated while reducing the influence caused by a coupling effect. The present invention also provides an effect of amplifying the difference among the voltages to be input to a comparator circuit, when generating the reference voltage. This will be described in more detail below.

A reference voltage generation circuit according to the present invention operates as follows. A reference cell has a structure similar to that of a reading memory cell. With reference to FIG. 1, a drain electrode of the reference cell is connected to a node 2 acting as an input end of a plurality of first pre-sense circuit 21A. A reference output line, connected to a load circuit having the same structure as the load circuit connected to the reading memory cell, is also connected to the node 2 acting as the input end of the plurality of first pre-sense circuits 21A. Through the plurality of first pre-sense circuits 21A, a plurality of voltages having the same current vs. voltage characteristics are obtained at nodes 4.

The plurality of nodes 4 are respectively connected to a plurality of nodes 6 through second pre-sense circuits 21B. A plurality of voltages having the same current vs. voltage characteristics are obtained at the nodes 6. The plurality of voltages are respectively input to input ends of a plurality of comparator circuits 14. In other words, a third pre-sense circuit 13A and a fourth pre-sense circuit 13B are provided between the bit output line and the comparator circuits 14, and first pre-sense circuits 21A and the second pre-sense circuits 21B are provided between the reference output line and the comparator circuits 14. Due to such a structure, the voltage at the bit output line and the voltage at the reference output line are converted into a prescribed voltage, and a plurality of voltages converted to have a prescribed value based on the reference output line are generated. As a result, a plurality of reference voltages to be input to the comparator circuits can be generated by one reference cell. In this manner, the plurality of comparator circuits can be simultaneously operated without commonly inputting a reference voltage to the plurality of comparator circuits as is conventional.

The difference between (i) a voltage which is sent from the bit output line to each comparator circuit 14 through a third pre-sense circuit 13A and a fourth pre-sense circuit 13B (hereinafter, referred to as a "comparator input bit line voltage") and (ii) a voltage which is sent from the reference output line to each comparator circuit 14 through the first pre-sense circuit 21A and a second pre-sense circuit 21B (hereinafter, referred to as a "comparator input reference line voltage") can be larger than the difference between the bit line output voltage and the reference line output voltage.

The above feature results from the following principle. The bit line output voltage and the reference line output voltage both have an upper limit as described above. The upper limit is necessary because the reading drain voltage cannot be very high since an excessively high reading drain voltage may destroy the state of containing electrons of the floating gate electrode which is formed by the writing operation. By contrast, neither the comparator input bit line voltage nor the comparator input reference line voltage has such an upper limit. Therefore, the voltage difference can be large by the combination of the first pre-sense circuit 21A (or the third pre-sense circuit 13A) and the second pre-sense circuit 21B (or the fourth pre-sense circuit 13B).

As described above, according to the present invention, a plurality of reference voltages can be generated so as to have a reduced timewise delay from at least one reference cell, and therefore, a plurality of sense amplifier circuits can be simultaneously operated while reducing the influence caused by a coupling effect. The present invention also provides an effect of amplifying the voltage difference to be input to the sense amplifier circuit, when generating the reference voltage.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A reference voltage generation circuit, comprising:
   at least one reference cell having a source electrode and a drain electrode;
   a plurality of first sense circuits connected to the reference cell and including an N-channel transistor, a P-channel transistor, a plurality of input ends and a plurality of output ends; and
   a plurality of second sense circuits each for receiving an output from a corresponding one of the plurality of first sense circuits, the plurality of second sense circuits each having a load circuit, an N-channel transistor, a plurality of input ends and a plurality of output ends.

2. A reference voltage generation circuit according to claim 1, wherein the plurality of first sense circuits each generate a first duplicate voltage based on a voltage from the reference cell, and the plurality of second sense circuits each generate a second duplicate voltage based on the first duplicate voltage.

3. A memory reading circuit for a semiconductor memory device, comprising:
   a reference voltage generation circuit according to claim 2;
   a third sense circuit connected to a selected memory cell and having an N-channel transistor, a P-channel transistor, a plurality of input ends and a plurality of output ends; and
   a fourth sense circuit for receiving an output from the third sense circuit, the fourth sense circuit having a load circuit, an N-channel transistor, a plurality of input ends and a plurality of output ends,
   wherein the information is read using an output from each of the plurality of second sense circuits and an output from the fourth sense circuit.

4. A memory reading circuit according to claim 3, for reading information from the selected memory cell by supplying a reference voltage to one of two input ends of a sense amplifier and supplying a voltage from the selected memory cell to the other of the two input ends, wherein an output from each of the plurality of second sense circuits and an output from the fourth sense circuit are input to the sense amplifier.

5. A memory reading circuit according to claim 4, wherein:
- the load circuit of each of the plurality of second sense circuits of the reference voltage generation circuit is a P-channel transistor, and the load circuit of the fourth sense circuit is a P-channel transistor, and
- a gate electrode and a drain electrode of one of the plurality of second sense circuits are connected to a gate electrode of the P-channel transistor of the fourth sense circuit, so that a load characteristic of the fourth sense circuit is equal to a load characteristic of the one of the plurality of second sense circuits.

6. A memory reading circuit according to claim 5, wherein the reference voltage generation circuit shortcircuits an output from the fourth sense circuit and an output from the one of the plurality of second sense circuits through a transistor, and the output from the fourth sense circuit and the output from the one of the plurality of second sense circuits are transferred to a respective prescribed potential from the same level after being released from the shortcircuiting.

7. A memory reading circuit according to claim 3, wherein an output from each of the plurality of second sense circuits and an output from the fourth sense circuit are shortcircuitable, and the output from the fourth sense circuit is output through an inverter circuit.

8. A memory reading circuit according to claim 7, wherein:
- the load circuit of each of the plurality of second sense circuits of the reference voltage generation circuit is a P-channel transistor, and the load circuit of the fourth sense circuit is a P-channel transistor, and
- a gate electrode and a drain electrode of one of the plurality of second sense circuits are connected to a gate electrode of the P-channel transistor of the fourth sense circuit, so that a load characteristic of the fourth sense circuit is equal to a load characteristic of the one of the plurality of second sense circuits.

9. A memory reading circuit according to claim 8, wherein the reference voltage generation circuit shortcircuits an output from the fourth sense circuit and an output from the one of the plurality of second sense circuits through a transistor, and the output from the fourth sense circuit and the output from the one of the plurality of second sense circuits are transferred to a respective prescribed potential from the same level after being released from the shortcircuiting.

10. A memory reading circuit for a semiconductor memory device, comprising:
- a reference voltage generation circuit according to claim 1;
- a third sense circuit connected to a selected memory cell and having an N-channel transistor, a P-channel transistor, a plurality of input ends and a plurality of output ends; and
- a fourth sense circuit for receiving an output from the third sense circuit, the fourth sense circuit having a load circuit, an N-channel transistor, a plurality of input ends and a plurality of output ends,
- wherein the information is read using an output from each of the plurality of second sense circuits and an output from the fourth sense circuit.

11. A memory reading circuit according to claim 10, for reading information from the selected memory cell by supplying a reference voltage to one of two input ends of a sense amplifier and supplying a voltage from the selected memory cell to the other of the two input ends, wherein an output from each of the plurality of second sense circuits and an output from the fourth sense circuit are input to the sense amplifier.

12. A memory reading circuit according to claim 11, wherein:
- the load circuit of each of the plurality of second sense circuits of the reference voltage generation circuit is a P-channel transistor, and the load circuit of the fourth sense circuit is a P-channel transistor, and
- a gate electrode and a drain electrode of one of the plurality of second sense circuits are connected to a gate electrode of the P-channel transistor of the fourth sense circuit, so that a load characteristic of the fourth sense circuit is equal to a load characteristic of the one of the plurality of second sense circuits.

13. A memory reading circuit according to claim 12, wherein the reference voltage generation circuit shortcircuits an output from the fourth sense circuit and an output from the one of the plurality of second sense circuits through a transistor, and the output from the fourth sense circuit and the output from the one of the plurality of second sense circuits are transferred to a respective prescribed potential from the same level after being released from the shortcircuiting.

14. A memory reading circuit according to claim 11, further comprising a load circuit for performing current-to-voltage conversion of the selected memory cell and the reference cell, the load circuit including at least one of a transistor and a resistor, wherein the load circuit is directly connected to a drain electrode of the selected memory cell and the drain electrode of the reference cell.

15. A memory reading circuit according to claim 10, wherein an output from each of the plurality of second sense circuits and an output from the fourth sense circuit are shortcircuitable, and the output from the fourth sense circuit is output through an inverter circuit.

16. A memory reading circuit according to claim 15, wherein:
- the load circuit of each of the plurality of second sense circuits of the reference voltage generation circuit is a P-channel transistor, and the load circuit of the fourth sense circuit is a P-channel transistor, and
- a gate electrode and a drain electrode of one of the plurality of second sense circuits are connected to a gate electrode of the P-channel transistor of the fourth sense circuit, so that a load characteristic of the fourth sense circuit is equal to a load characteristic of the one of the plurality of second sense circuits.

17. A memory reading circuit according to claim 16, wherein the reference voltage generation circuit shortcircuits an output from the fourth sense circuit and an output from the one of the plurality of second sense circuits through a transistor, and the output from the fourth sense circuit and the output from the one of the plurality of second sense circuits are transferred to a respective prescribed potential from the same level after being released from the shortcircuiting.

18. A memory reading circuit according to claim 15, further comprising a load circuit for performing current-to-voltage conversion of the selected memory cell and the reference cell, the load circuit including at least one of a transistor and a resistor, wherein the load circuit is directly connected to a drain electrode of the selected memory cell and the drain electrode of the reference cell.

19. An electronic information device capable of reading information using a memory reading circuit according to claim 10.

20. An electronic information device capable of reading information using a memory reading circuit according to claim 1.

* * * * *